(12) United States Patent
Kim et al.

(10) Patent No.: US 6,410,381 B2
(45) Date of Patent: Jun. 25, 2002

(54) METHOD FOR FORMING CAPACITOR OF SEMICONDUCTOR DEVICE

(75) Inventors: Kyong Min Kim, Kyoungki-do; Kyung Cheol Jeong, Chungcheongbuk-do; Han Sang Song, Seoul; Dong Jun Kim, Kyoungki-do, all of (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 09/867,658

(22) Filed: May 31, 2001

(30) Foreign Application Priority Data

Jun. 1, 2000 (KR) ........................................ 2000-30090

(51) Int. Cl.$^7$ .......................................... H01L 21/8242
(52) U.S. Cl. ........................ 438/240; 438/243; 438/250; 438/386; 438/393; 438/396
(58) Field of Search ................................ 438/240, 250, 438/253, 386–387, 393, 396, 397, 243

(56) References Cited

U.S. PATENT DOCUMENTS

| 6,326,259 B1 | * | 12/2001 | Kim et al. | .................. | 438/240 |
| 2001/0006838 A1 | * | 7/2001 | Won et al. | .................. | 438/396 |
| 2002/0001893 A1 | * | 1/2002 | Kim et al. | .................. | 438/200 |
| 2002/0019110 A1 | * | 2/2002 | Lee et al. | .................. | 438/398 |

OTHER PUBLICATIONS

D.Y. Yang et al., Characterization of Ru Electrodes for Ru/(Ba,Sr)TiO3/Ru Capacitors. IEEE 1996, pp. 515–518.*
J.W. Kim et al., Development of Ru/Ta2O3/Ru Capacitor Technology for Giga–Scale DRAMs. IEDM 1999, pp. 793–796.*
S–J. Won et al., Conformal CVD–Ruthenium Process for MIM Capacitor in Giga–Bit DRAMs. IEDM 2000, pp. 789–792.*
W.D. Kim et al., Development of CVD–Ru/Ta2O5/CVD–TiN Capacitor for Multigigabit–Scale DRAM Generation. IEEE 2000, pp. 100–101.*
M. Hiratani et al., A Conformal Ruthenium Electrode for MIM Capacitors in Gbit DRAMs Using the CVD Technology Based on Oxygen–Controlled Surface Reaction. IEEE 2000, pp. 102–103.*
Y. Fukuzumi et al., Liner–Supported Cylinder (LSC) Technology to Realize Ru/Ta2O5/Ru Capacitor for Future DRAMs. IEDM 2000, pp. 793–796.*

* cited by examiner

Primary Examiner—Olik Chaudhuri
Assistant Examiner—Anh Duy Mai
(74) Attorney, Agent, or Firm—Finnegan, Henderson, Farabow, Garrett & Dunner, L.L.P.

(57) ABSTRACT

The present invention discloses a method for forming a capacitor of a semiconductor device which can increase a capacitance and prevent a leakage current at the same time. The method includes the steps of depositing a cap oxide film on a semiconductor substrate, patterning the cap oxide film to expose a capacitor region of the semiconductor substrate, consecutively depositing an Ru film for a lower electrode on the patterned cap oxide film and the semiconductor substrate in in-situ according to a low pressure chemical vapor deposition(LPCVD) and a plasma enhanced chemical vapor deposition(PECVD), forming a cylindrical lower electrode, by performing a chemical mechanical polishing process on the Ru film and removing the cap oxide film, forming an amorphous TaON film having a high dielectric constant on the lower electrode, crystallizing the amorphous TaON film according to a thermal treatment, and forming a metal film for an upper electrode on the crystallized TaON film.

19 Claims, 3 Drawing Sheets

US 6,410,381 B2

1

METHOD FOR FORMING CAPACITOR OF SEMICONDUCTOR DEVICE

CROSS REFERENCE TO RELATED APPLICATIONS

This application claims priority from Korean Patent Application No. 2000-30090, filed Jun. 1, 2000, the entirety of which is incorporated herein by reference.

BACKGROUND OF THE INVENTION

1. Field of the Invention

The present invention relates to a method for forming a capacitor of a semiconductor device, and in particular to an improved method for forming a capacitor of a semiconductor device which can increase a capacitance and prevent a leakage current at the same time.

2. Description of the Background Art

The capacitance of a capacitor used as a data storage unit in the semiconductor device is dependent upon the area of the electrode, the gap between the electrodes and a dielectric constant of a dielectric film inserted between the electrodes. However, semiconductor devices have become highly integrated. Accordingly, the capacitor formation region of the semiconductor device has decreased, and thus the area of the electrode of the capacitor has also decreased, thereby reducing the capacitance of the capacitor.

Therefore, in a capacitor having a structure of metal film—dielectric film—metal film (MIM), an Ru film is deposited as a lower electrode, a TaON film having a high dielectric constant is deposited thereon, and a metal film is deposited on the dielectric film, thereby maximizing the capacitance of the TaON capacitor.

FIGS. 1 and 2 are cross-sectional diagrams illustrating sequential steps of a conventional method for forming a capacitor of a semiconductor device.

As illustrated in FIG. 1, a semiconductor substrate(not shown) including a MOSFET is provided. Here, a polysilicon film 5 for a plug and a barrier metal film 6 consisting of a Ti/TiN film are sequentially stacked on an interlayer insulation film 4 having a contact hole(not shown) exposing one of the junction regions of the MOSFET(not shown).

A cap oxide film 7 is deposited on the semiconductor substrate 2 in order to form a cylindrical capacitor.

Thereafter, the cap oxide film 7 is patterned to define a capacitor region and expose the interlayer insulation film 4 and the barrier metal film 6.

An Ru film 8 for a lower electrode is deposited over the patterned cap oxide film 7a. When the metal film is used as the lower electrode, a leakage current property may be improved according to quality of the lower electrode.

In addition, the Ru film 8 may be deposited as the lower electrode according a chemical vapor deposition (CVD), a physical vapor deposition (PVD), a low pressure chemical vapor deposition (LPCVD) and a plasma enhanced chemical vapor deposition (PECVD).

When the Ru film 8 is deposited according to the CVD, a deposition rate of the Ru film 8 is slow on the cap oxide film 7a, and the surface of the Ru film 8 is inferior. It is thus difficult to apply the CVD to the actual process.

On the other hand, when the Ru film 8 is deposited according to the PECVD, the quality of the film is superior, but a step coverage, namely a deposition state is inferior. Accordingly, the PECVD is not suitable for the method for forming the capacitor.

2

When the Ru film 8 is deposited according to the LPCVD, the step coverage is superior, but the quality of the film is reduced, as compared with the PECVD.

As a result, the Ru film 8 is deposited according to the PVD, and re-deposited according to the CVD, thereby improving the deposition rate and quality of the Ru film 8.

Referring to FIG. 2, a chemical mechanical polishing process is performed on the Ru film 8 for the lower electrode, and the cap oxide film 7a is removed, thereby forming an Ru film 8a which is a cylindrical lower electrode. A TaON film 9 having a high dielectric constant is formed on the cylindrical Ru film 8a, and an upper electrode 10 is formed on the TaON film 9, thereby forming the capacitor of the semiconductor device.

However, the conventional method for forming the capacitor of the semiconductor device has the following disadvantages.

When the Ru film is deposited as the lower electrode, the deposition rate and quality of the Ru film can be improved by depositing the Ru film according to the PVD, and re-depositing the Ru film according to the CVD. However, such a deposition process cannot be performed in in-situ, and thus an impurity may be put on the wafer surface during a transfer from one chamber to another chamber.

SUMMARY OF THE INVENTION

Accordingly, the present invention provides a method for forming a capacitor of a semiconductor device which can improve a film quality of a lower electrode.

Additionally, the present invention provides a method for forming a capacitor of a semiconductor device which can obtain a high capacitance and a low leakage current at the same time.

The present invention thus provides a method for forming a capacitor of a semiconductor device, including the steps of depositing a cap oxide film on a semiconductor substrate; patterning the cap oxide film to expose a capacitor region of the semiconductor substrate; consecutively depositing an Ru film for a lower electrode on the patterned cap oxide film and the semiconductor substrate in in-situ according to a low pressure chemical vapor deposition and a plasma enhanced chemical vapor deposition; forming a cylindrical lower electrode, by performing a chemical mechanical polishing process on the Ru film and removing the cap oxide film; forming an amorphous TaON film on the lower electrode; crystallizing the amorphous TaON film according to a thermal treatment; and forming a metal film for an upper electrode on the crystallized TaON film.

In addition, there is provided a method for forming a capacitor of a semiconductor device, including the steps of depositing a cap oxide film on a semiconductor substrate; patterning the cap oxide film to expose a capacitor region of the semiconductor substrate; consecutively depositing an Ru film for a lower electrode on the patterned cap oxide film and the semiconductor substrate in in-situ according to a low pressure chemical vapor deposition and a plasma enhanced chemical vapor deposition; forming a cylindrical lower electrode, by performing a chemical mechanical polishing process on the Ru film and removing the cap oxide film; forming an amorphous TaON film on the lower electrode; performing a plasma treatment on the amorphous TaON film; crystallizing the amorphous TaON film according to a thermal treatment such as an RTP; and forming a metal film for an upper electrode on the crystallized TaON film.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for forming a capacitor of a semiconductor device in accordance with the present invention will now be described in detail with reference to the accompanying drawings.

FIGS. 3, 4, 5, and 6 are cross-sectional diagrams illustrating sequential steps of a method for forming the capacitor of the semiconductor device in accordance with the present invention.

Figure 1:
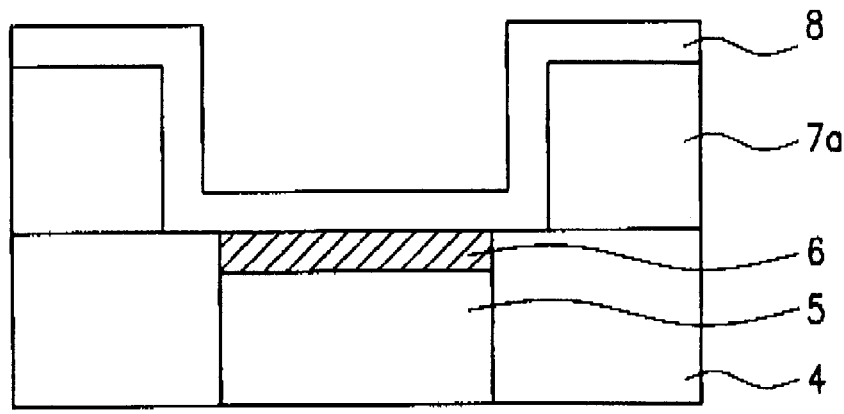
FIGS. 1 and 2 are cross-sectional diagrams illustrating sequential steps of a conventional method for forming a capacitor of a semiconductor device.
Figure 2:
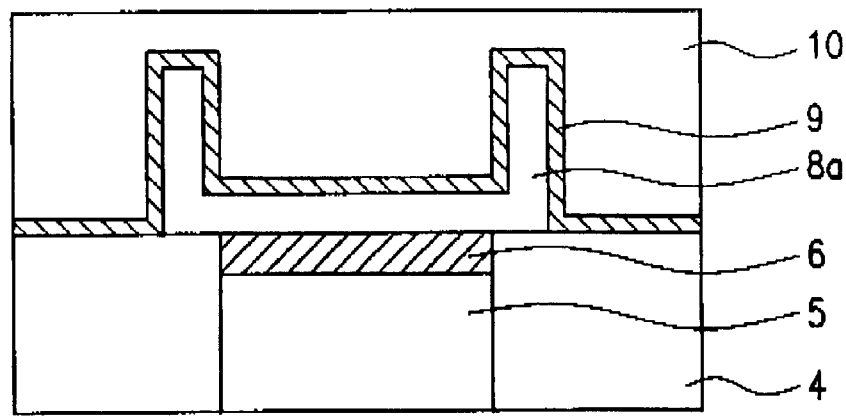
Figure 3:
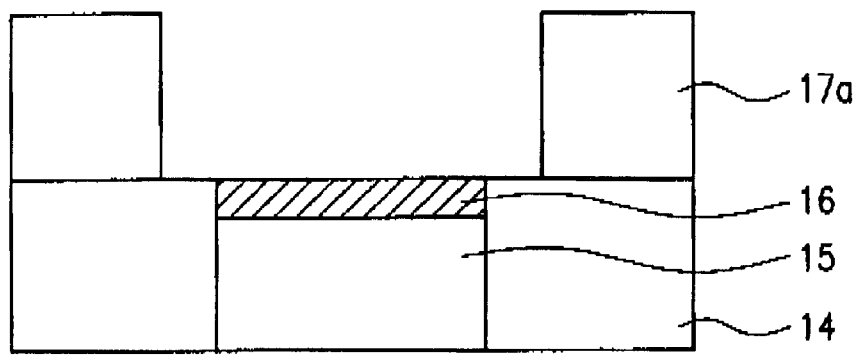
FIGS. 3, 4, 5, and 6 are cross-sectional diagrams illustrating sequential steps of a method for forming a capacitor of a semiconductor device in accordance with the present invention.

As illustrated in FIG. 3, an interlayer insulation film 14 having a contact hole (not shown) exposing one of the junction regions is formed on a semiconductor substrate(not shown) having a MOSFET (not shown).

A plug polysilicon film 15 is formed on the contact hole(not shown) of the interlayer insulation film 14. The surface of the polysilicon film 15 is etched according to an etch back process using an HF solution and a buffer oxide etching agent, thereby removing a natural oxide film.

Thereafter, a barrier metal film 16 consisting of a Ti/TiN film is formed on the etched polysilicon film 15, thereby filling up the contact hole(not shown). A chemical mechanical polishing process is performed thereon until the interlayer insulation film 14 is exposed. A cap oxide film 17 is deposited on a resultant material(A).

A patterned cap oxide film 17a is formed to define a presumed cylindrical capacitor region and to expose the interlayer insulation film 14 and the barrier metal film 16.

Figure 4:
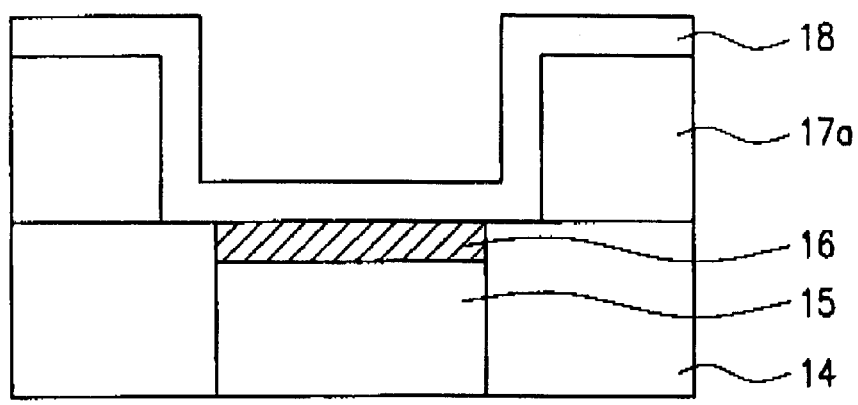

As depicted in FIG. 4, an Ru film 18 for a lower electrode is deposited on the patterned cap oxide film 17a. Here, the Ru film 18 is consecutively deposited according to a two-step deposition method. That is, the Ru film 18 is deposited according to a low pressure chemical vapor deposition (LPCVD), and re-deposited in in-situ according to a plasma enhanced chemical vapor deposition (PECVD).

In the LPCVD, the Ru film 18 is partially deposited by forming tris 2,4-octanedionato Ru in a vapor state, and maintaining a temperature of the semiconductor substrate at 200 to 350° C., a flow rate of $O_2$ reaction gas at a few tens to a few hundreds standard cubic centimeters per minute (sccm), and a pressure of a reactor at a few mTorr to a few Torr.

Thereafter, the Ru film 18 is partially deposited in in-situ according to the PECVD using plasma. Here, an RF power ranges from 100 to 300W, a sub heater applies the power to a ground, and a shower head applies the power to an electrode.

Figure 5:
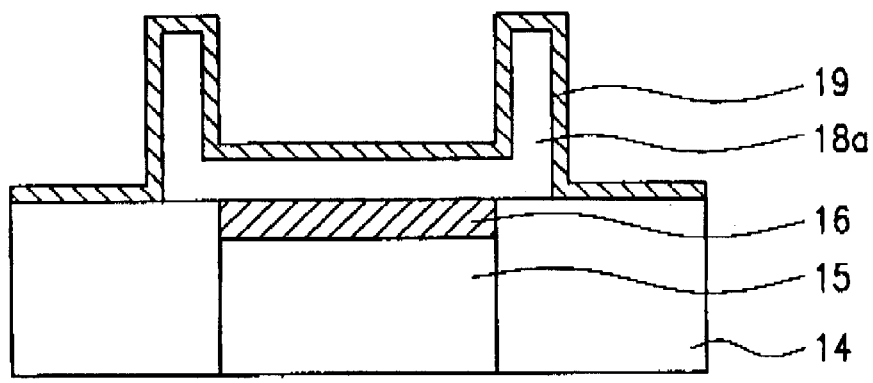

As shown in FIG. 5, the chemical mechanical polishing process is performed on the Ru film 18 for the lower electrode, and the cap oxide film is removed, thereby forming a cylindrical lower electrode 18a.

An amorphous TaON film 19 having a high dielectric constant is formed on the cylindrical lower electrode 18a. Here, the amorphous TaON film 19 is formed according to a chemical vapor deposition, for example the LPCVD. Here, $Ta(OC_2H_5)_5$ is formed in a vapor state in a vaporizer having a temperature of 170 to 190° C., and $NH_3$ having a flow rate of 10 to 1000 sccm is reacted with chemical Ta vapor in an LPCVD chamber maintaining a pressure of 0.1 to 1.2 Torr and a temperature of 300 to 400° C., and receiving $NH_3$ gas.

Thereafter, $N_2O$ plasma or $UV/O_3$ treatment is carried out at 300 to 500° C. by considering an electric property of the capacitor.

Figure 6:
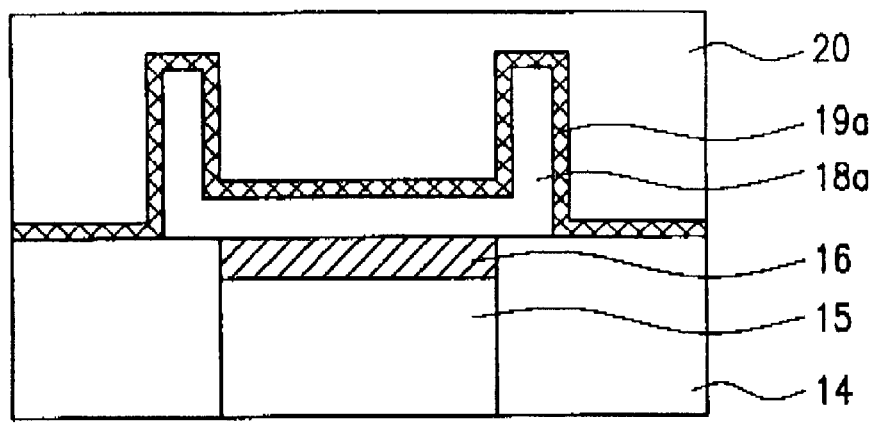

Referring to FIG. 6, an rapid thermal process (RTP) process is performed on the amorphous TaON film 19 at 500 to 650° C. by using $N_2$ gas and $O_2$, thereby forming a crystallized TaON film 19a. Preferably, an Ru film or TiN film is deposited on the TaON film 19a as an upper electrode 20, and thus formation of the capacitor is finished.

As discussed earlier, the Ru film is consecutively deposited according to a two-step deposition method. That is, the Ru film is deposited according to the LPCVD, and re-deposited in in-situ according to the PECVD using plasma.

Accordingly, a deposition rate and quality of the Ru film are improved, thereby obtaining a high capacitance and a low leakage current at the same time.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method of forming a capacitor of a semiconductor device, comprising:

providing a semiconducotor substrate;

forming a lower electrode on the semiconductor substrate, said lower electrode comprising an Ru film formed in-situ, said in-situ forming comprising in sequential order a low pressure chemical vapor deposition (LPCVD) and a plasma enhanced chemical vapor deposition (PECVD);

forming an amorphous TaON film on the lower electrode;

crystallizing the amorphous TaON film, said crystallizing comprising a thermal treatment; and forming an upper electrode on the crystallized TaON film.

2. The method according to claim 1, wherein forming the Ru film comprises partial deposition using LPCVD and partial deposition using PECVD.

3. The method according to claim 2, wherein the partial deposition using LPCVD comprises forming tris 2,4-octanedionato Ru in a vapor state; and maintaining the semiconductor substrate at a temperature ranging from 200 to 350° C., an $O_2$ reaction gas flow rate ranging from 20 to less than 1,000 sccm, and a reactor pressure ranging from 2 mTorr to less than 1,000 Torr.

4. The method according to claim 3, wherein the partial deposition using PECVD comprises maintaining an RF power ranging from 100 to 300 W applied between a ground of a sub heater and an electrode of a shower head.

5. The method according to claim 1, wherein the LPCVD comprises forming vapor comprising Ta by vaporizing $Ta(OC_2H_5)_5$ in a vaporizer having a temperature ranging from 170 to 190° C., and reacting $NH_3$ gas having a flow rate ranging from 10 to 1000 sccm with the vapor comprising Ta in an LPCVD chamber at a pressure ranging from 0.1 to 1.2 Torr and a temperature ranging from 300 to 400° C.

6. The method according to claim 1, further comprising, prior to said crystallizing, performing a treatment chosen from $N_2O$ plasma and $UV/O_3$ treatments at a temperature ranging from 300 to 500° C.

7. The method according to claim 1, wherein said crystallizing comprises performing a rapid thermal process (RTP) process on the amorphous TaON film at a temperature ranging from 500 to 650° C. and using at least one of $N_2$ and $O_2$ gases.

8. The method according to claim 1, wherein said upper electrode comprises at least one of an Ru film and a TiN film deposited on the crystallized TaON film.

9. A method of forming a capacitor of a semiconductor device, comprising:
providing a semiconductor substrate;
forming a lower electrode on the semiconductor substrate, said lower electrode comprising an Ru film formed in-situ, said in-situ forming comprising in sequential order a low pressure chemical vapor deposition (LPCVD) and a plasma enhanced chemical vapor deposition (PECVD);
forming an amorphous TaON film on the lower electrode;
performing a plasma treatment on the amorphous TaON film;
crystallizing the amorphous TaON film, said crystallizing comprising a thermal treatment; and
forming an upper electrode comprising a metal film on the crystallized TaON film.

10. The method according to claim 9, wherein forming the Ru film comprises partial deposition using LPCVD and partial deposition using PECVD.

11. The method according to claim 10, wherein the partial deposition using LPCVD comprises forming tris 2,4-octanedionato Ru in a vapor state; and maintaining the semiconductor substrate at a temperature ranging from 200 to 350° C., a $O_2$ reaction gas flow rate ranging from 20 to less than 1,000 sccm, and a reactor pressure ranging from 2 mTorr to less than 1,000 Torr.

12. The method according to claim 11, wherein the partial deposition using PECVD comprises maintaining an RF power ranging from 100 to 300W applied between a ground of a sub heater and an electrode of a shower head.

13. The method according to claim 9, wherein the LPCVD comprises forming vapor comprising Ta by vaporizing $Ta(OC_2H_5)_5$ in a vaporizer having a temperature ranging from 170 to 190° C., and reacting $NH_3$ gas having a flow rate ranging from 10 to 1000 sccm with the vapor comprising Ta in an LPCVD chamber at a pressure ranging from 0.1 to 1.2 Torr and a temperature ranging from 300 to 400° C.

14. The method according to claim 9, wherein the plasma treatment for the amorphous TaON film comprises at least one of an $N_2O$ plasma and a $UV/O_3$ treatment at a temperature ranging from 300 to 500° C.

15. The method according to claim 9, wherein said crystallizing comprises a rapid thermal process (RTP) process at a temperature ranging from 500 to 650° C. using $N_2$ gas and $O_2$.

16. The method according to claim 9, wherein said upper electrode comprises at least one of an Ru film and a TiN film deposited on the crystallized TaON film.

17. The method according to claim 9, wherein said lower electrode is a cylindrical shape.

18. A method of forming a capacitor of a semiconductor device, comprising:
providing a semiconductor substrate;
forming a lower electrode on the semiconductor substrate, said lower electrode comprising an Ru film formed in-situ, said in-situ forming comprising in sequential order a low pressure chemical capor deposition (LPCVD) and a plasma enhanced chemical vapor deposition (PECVD);
forming an amorphous TaON film on the lower electrode;
performing a plasma treatment on the amorphous TaON film, said performing a plasma treatment comprising at least one of an $N_2O$ plasma and a $UV/O_3$ treatment at a temperature ranging from 300 to 500° C.;
crystallizing the amorphous TaON film, said crystallizing comprising a thermal treatment; and
forming an upper electrode comprising a metal film on the crystallized TaON film, said upper electrode comprising at least one of an Ru film and a TiN film.

19. The method according to claim 18, wherein said crystallizing comprises ad rapid thermal process (RTP) at a temperature ranging from 500 to 600° C. using $N_2$ gas and $O_2$.

* * * * *

UNITED STATES PATENT AND TRADEMARK OFFICE
CERTIFICATE OF CORRECTION

PATENT NO.     : 6,410,381 B2                                                Page 1 of 1
DATED          : June 25, 2002
INVENTOR(S)    : Kyong Min Kim et al.

It is certified that error appears in the above-identified patent and that said Letters Patent is hereby corrected as shown below:

<u>Column 4,</u>
Line 37, "semiconducotor" should read -- semiconductor --.

<u>Column 6,</u>
Line 20, "capacitator" should read -- capacitor --.
Line 27, "capor" should read -- vapor --.
Line 41, "ad" should read -- a --.

Signed and Sealed this

Eighth Day of April, 2003

JAMES E. ROGAN
*Director of the United States Patent and Trademark Office*